(12) United States Patent
Brown

(10) Patent No.: US 6,348,734 B1
(45) Date of Patent: Feb. 19, 2002

(54) SELF-ALIGNED COPPER INTERCONNECT ARCHITECTURE WITH ENHANCED COPPER DIFFUSION BARRIER

(75) Inventor: Kevin C. Brown, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/430,715

(22) Filed: Oct. 29, 1999

Related U.S. Application Data

(62) Division of application No. 09/295,892, filed on Apr. 21, 1999, now Pat. No. 6,030,896.

(51) Int. Cl.[7] .......................... H01L 23/48; H01L 23/52
(52) U.S. Cl. .................. 257/767; 257/751; 257/758; 257/762; 257/773
(58) Field of Search .................. 257/758, 762, 257/767, 773, 774, 776, 751, 752, 753; 438/118, 618, 619, 622, 629, 637, 639

(56) References Cited

U.S. PATENT DOCUMENTS

| | | | |
|---|---|---|---|
| 4,917,759 A | 4/1990 | Fisher et al. | 156/643 |
| 5,258,096 A | 11/1993 | Sandhu et al. | 156/643 |
| 5,451,543 A | 9/1995 | Woo et al. | 437/195 |
| 5,470,789 A | * 11/1995 | Misawa | 438/643 |
| 5,793,112 A | * 8/1998 | Hasegawa et al. | 257/758 |
| 6,060,383 A | * 5/2000 | Nogami et al. | 438/622 |

FOREIGN PATENT DOCUMENTS

JP          6-37190      * 2/1994

* cited by examiner

Primary Examiner—Steven Loke
Assistant Examiner—Hung Kim Vu
(74) Attorney, Agent, or Firm—Stallman & Pollock LLP

(57) ABSTRACT

A via is formed in a semiconductor device using a self-aligned copper-based pillar to connect upper and lower copper interconnect layers separated by a dielectric. The lower interconnect layer is formed on an underlying layer. The copper-based via pillar is formed on the lower interconnect layer. The upper interconnect layer is formed to make electrical contact to the exposed upper surface of the via pillar. Conductive diffusion barrier material is formed on vertical sidewalls of the lower interconnect layer.

8 Claims, 2 Drawing Sheets

SELF-ALIGNED COPPER INTERCONNECT ARCHITECTURE WITH ENHANCED COPPER DIFFUSION BARRIER

This is a divisional of application Ser. No. 09/295,892, filed Apr. 21, 1999 now U.S. Pat. No. 6,030,896.

TECHNICAL FIELD OF INVENTION

The present invention relates to fabrication of semiconductor integrated circuit structures. In particular, the invention relates to techniques for forming vias in multi-level interconnect integrated circuits using self-aligned copper-based via pillars and, preferably, copper as part of the upper level and lower level interconnect structure, and a conformal metal-like material, such as CVD TiN or PVD TaN, as a diffusion barrier for the copper interconnect structure.

DESCRIPTION OF RELATED ART

Integrated circuits commonly use multi-level metal interconnects to reduce the layout area required for the tens or hundreds of thousands of semiconductor elements that typically form an integrated circuit structure. This reduction in layout area is possible because the metal layers used in multi-level metal schemes are separated by dielectric material that allows criss-crossing of the separated metal layers without electrical shorting. Electrical connections between metal layers are created by forming small apertures in the dielectric material and filling the apertures with a conducting material, e.g. aluminum. These connections, usually made between consecutive metal layers, are known as "vias."

As semiconductor device geometries continue to shrink into the submicron range, it is increasingly difficult to maintain planar metal and dielectric surfaces during the formation of multi-level metal interconnect structures. This lack of planarity can cause several problems. For example, if the underlying topography coated by a photoresist layer contains abrupt steps, then the thickness of the photoresist layer will not be uniform. This can occur, for example, when the photoresist is applied over features formed earlier in a semiconductor device process that protrude from the surface of the structure. The resulting non-uniformity in the photoresist thickness can lead to some regions of the patterned photoresist layer being insufficiently thick to protect underlying features during a later etching step and other regions being excessively thick so that the full thickness of the photoresist layer cannot be exposed due to the depth-of-focus limitations of photolithography at sub-micron dimensions. Also, poor planarity of metal and dielectric layers promotes poor metal step coverage which increases metal sheet-resistance, susceptibility to current-stress failure, electromigration problems and the probability of electrical opens. In addition, poor planarity in underlying metal or dielectric layers formed earlier in a semiconductor device process further increases the difficulty of establishing planarity in overlying metal or dielectric layers formed later in the process.

Another difficulty associated with via formation for multi-level metal interconnect structures in sub-micron architectures is the alignment of upper and lower metal layers with a via aperture formed in an intermediate dielectric. This alignment is difficult to achieve because of the small distance between device features in sub-micron devices and, thus, the reduced tolerance available for alignment errors. Misalignment of a via relative to connected upper and lower metal layers can lead to reduced device yield, increased via resistance and poor metal coverage in the via. For example, in a standard via, misalignment of the via relative to the lower metal layer results in overetching into the dielectric underlying the lower metal layer, thereby increasing the aspect ratio of the via opening and preventing adequate step coverage when the via is later filled with metal. The result is a poor contact interface in the via and increased via resistance. Misalignment of an upper metal layer relative to a via results in overetching, or notching, of the lower metal layer. The notched lower metal layer exhibits increased current density and is, thus, more susceptible to failure from electromigration or current stress.

In many semiconductor devices, the layout dimensions of upper and lower metal layers connecting to vias are extended in the vicinity of the via to form a layout frame, or head, around the via. This is known as "framing" the via. The frame provides additional alignment margin such that if partial misalignment of an upper and lower metal layer relative to the intended via location occurs, the actual formed via will still overlie a portion of a lower metal layer or underlie a portion of an upper metal layer. However, an adverse effect of using framed vias in a semiconductor device layout is that the packing density is substantially decreased (or the layout area is substantially increased).

A third difficulty associated with via formation for multi-level metal interconnects in sub-micron architectures is the contact resistance of the vias caused by polymer residue formation during the etching of the vias. These residues are typically formed during plasma etching and may contaminate the bottom of the via, causing a poor metallurgical contact between the lower metal layer and the metal in the via.

Accordingly, a need exists for a method of forming a via for connecting multi-level metal interconnects in sub-micron semiconductor device architectures that improves the surface planarity of formed metal and dielectric layers, reduces problems associated with via misalignment, reduces contact resistance problems associated with polymer residues, and lowers associated manufacturing costs.

Commonly-assigned and co-pending Application Ser. No. 09/295,898, U.S. Pat. No. 6,103,629 filed on the same date as this application, titled "Self-Aligned Interconnect Using High Selectivity Metal Pillars and a Via Exclusion Mask", discloses techniques for forming vias in multi-level metal ICs using self-aligned metal via pillars between interconnect levels. The metal via pillars include an upper surface that exhibits high selectivity in the etch of the upper metal interconnect layer.

As new integrated circuit manufacturing technologies emerge, it has become possible to use copper, instead of, for example, aluminum, in commercial metal interconnect structures.

Commonly-assigned and co-pending Application Ser. No. 09/295,838, U.S. Pat. No. 6,140,238 filed on the same date as this application, titled "Self-Aligned Copper Interconnect Structure and Method of Manufacturing Same", discloses an interconnect structure that, in its preferred embodiment, provides copper-based lower and upper patterned interconnect layers that are separated by dielectric and connected by via pillars, also copper-based, that extend through the dielectric. A layer of silicon oxynitride (SiON) serves as a copper diffusion barrier layer.

SUMMARY OF THE INVENTION

The present invention provides self-aligned vias in a copper-based multi-level interconnect structure using a conformal metal-like material, such as CVD TiN or PVD TaN, as a copper diffusion barrier.

In accordance with a preferred embodiment of the invention, the lower conductive interconnect layer includes a diffusion barrier layer, a first copper-based layer formed on the diffusion barrier layer, and an etch stop layer formed on the copper-based layer. A second copper-based layer is formed on the etch stop layer and an optional conductive antireflective diffusion barrier layer is formed on the second copper-based layer. The upper antireflective diffusion barrier layer is then patterned and etched and utilized as a conventional hardmask to etch the second copper-based layer, the etch stop layer, the first copper-based layer and the lower diffusion barrier layer to define a patterned metal stack. A thin layer of conformal metal-like material, e.g. CVD TiN or PVD TaN, having good barrier properties against copper diffusion is then deposited over the patterned stack. An anisotropic spacer etchback of the conformal conductive barrier material is then performed such that barrier material is removed from horizontal surfaces, leaving conductive diffusion barrier material on vertical sidewalls of the patterned stack. A first dielectric material is then deposited, filling the gaps between the patterned stack. The structure is then planarized, e.g. using chemical mechanical polishing (CMP), leaving the upper surface of the patterned antireflective diffusion barrier layer exposed. The exposed antireflective diffusion barrier layer is then masked and etched to define copper-based via pillars that have caps formed of the conductive antireflective material. The etch stop layer serves as an etch stop to the copper etch. If the copper via pillar etch is selective to the conductive barrier material, then, to avoid shorts between via pillars, the via pillar etch must be followed by an isotropic etch of the exposed conductive barrier material that is selective to copper. If the copper via pillar etch is not selective to the conductive barrier material, then exposed conductive barrier material will be removed by the copper etch and the process can proceed. Since the conductive diffusion barrier material has now been removed wherever it was exposed by the copper etch, and since the exposed sidewalls of the via pillars are thus not now protected by a diffusion barrier, a layer of conformal diffusion barrier dielectric material, e.g. silicon nitride, is deposited over exposed surfaces. Following deposition of the conformal diffusion barrier dielectric material, the gaps between the via pillars are filled with dielectric material. The dielectric material is then planarized to expose the upper surface of the antireflective diffusion barrier material that caps the via pillars. An upper conductive layer is then formed in electrical contact with the exposed pillar caps. The upper conductive layer comprises a material having high selectivity to the material of the antireflective/diffusion barrier layer. Therefore, etching of the upper conductive layer during its patterning will not etch the underlying via pillars in the event of mask misalignment.

If an antireflective layer is not utilized on the copper via pillar layer, then a conventional hardmask, e.g. thick silicon dioxide, is used to pattern the metal stack. A hardmask is needed because a conventional photoresist mask will not survive the high temperatures needed to etch copper.

Use of a conformal metal-like diffusion barrier material, such as CVD TiN or PVD TaN, improves over use of other copper barrier diffusion materials, such as SiON. SiON has a higher dielectric constant than oxide, so RC time delay and intralayer metal capacitance is improved because there is no SiON. Because insulator material SiON is replaced with a conductor, lower resistivity, improved current flow and, thus, improved device speed, are obtained.

A better understanding of the features and advantages of the present invention will be obtained by reference to the following detailed description and accompanying drawings which set forth an illustrative embodiment in which the principles of the invention are utilized.

DETAILED DESCRIPTION

FIGS. 1–6 illustrate a preferred method of forming self-aligned copper via piilars to connect upper and lower patterned copper interconnect layers using a conductive diffusion barrier.

Figure 1:
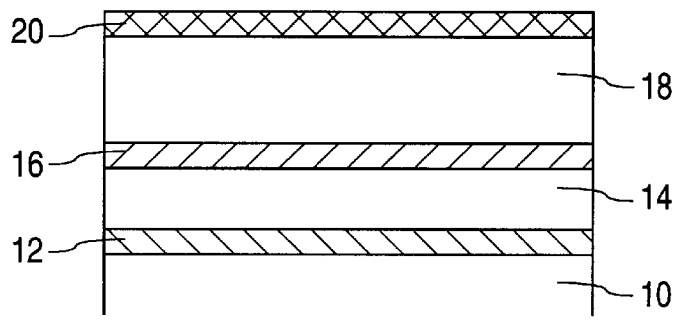
FIGS. 1–6 illustrate process steps of a method in accordance with the present invention.

In the disclosed process, as shown in FIG. 1, a first layer 10 of dielectric material, e.g. silicon oxide, is deposited overlying a semiconductor substrate (not shown). A layer 12 of conductive diffusion barrier material is then deposited over the first dielectric layer 10. The diffusion barrier layer 12 may be tantalum, tantalum nitride, tungsten, tungsten nitride, titanium, titanium nitride, or any other conductive material that performs well as a diffusion barrier to copper.

Although dielectric layer 10 is described above as formed over a silicon substrate, those skilled in the art will appreciate that it is possible for numerous structures, such as field oxide regions, polysilicon regions, metal regions and active device regions, to underlie dielectric layer 10, all in accordance with the concepts of the present invention. These underlying structures do not directly effect the practice of the invention because layer 10 is planarized using an etchback method, spin on glass (SOG), reflow, CMP or similar processing before forming overlying layers thereon. For example, layer 10 can be a deposited silicon dioxide layer planarized by CMP or by an etchback, as is well known in the art.

Next, a layer 14 of copper is formed over the diffusion barrier layer 12. A conductive etch stop layer 16 is then deposited on the copper layer 14. The etch stop layer 16 must be both a good etch stop material during copper etch as well as a good barrier against copper diffusion. Tungsten, tungsten nitride, and tungsten silicide are suitable for this purpose.

A second layer 18 of copper is then deposited on the etch stop layer 16. In a preferred embodiment of the invention, a conductive antireflective diffusion barrier layer 20 is deposited overlying the second copper layer 18, resulting in the structure shown in FIG. 1. The antireflective barrier diffusion layer 20 must be an antireflective material that exhibits high selectivity to copper etch and is also a good barrier against copper diffusion. Once again, tantalum, tantalum nitride, tungsten, tungsten nitride, titanium and titanium nitride are suitable choices.

Figure 2:
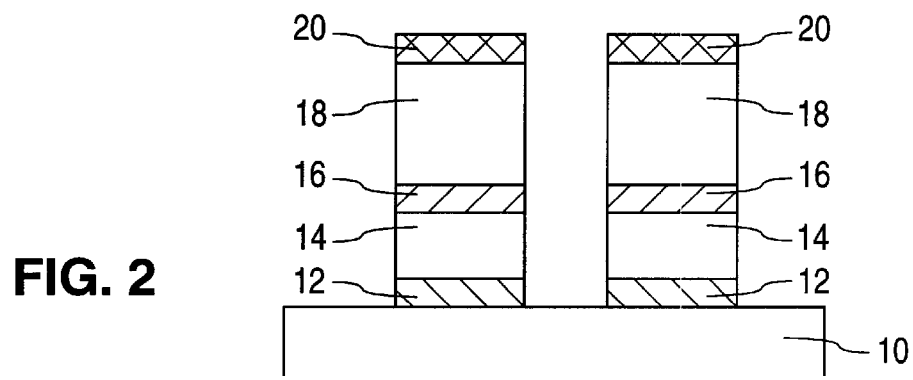

Following deposition of the antireflective barrier diffusion layer 20, the layer 20 is masked and patterned in the conventional manner to provide a mask for the subsequent etching of the underlying layers. The patterned layer 20 is then used as a hardmask to etch the second copper layer 18, the etch stop layer 16, the first copper layer 14 and the lower diffusion barrier layer 12 to define a patterned metal stack, as shown in FIG. 2 (If the antireflective layer 20 is not utilized, then, because photoresist will not survive the high temperatures needed for etching copper, a thick silicon oxide layer must formed on the second copper layer 18 and patterned to serve as a hardmask for etching the metal stack.).

Figure 3:
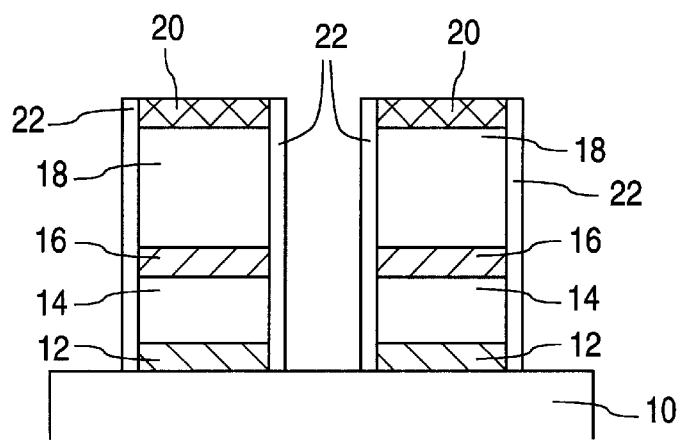

Referring to FIG. 3, a thin layer of conductive material having good barrier properties against copper diffusion is then deposited over the patterned stack. Preferably, the conductive material is a conformal metal-like material such as CVD TiN or PVD TaN. An anisotropic etchback is then performed such that conductive barrier material 22 is removed from the horizontal surfaces of the patterned structure, leaving conductive material 22 as a diffusion barrier on vertical sidewalls of the patterned stack, as shown in FIG. 3.

Figure 4:
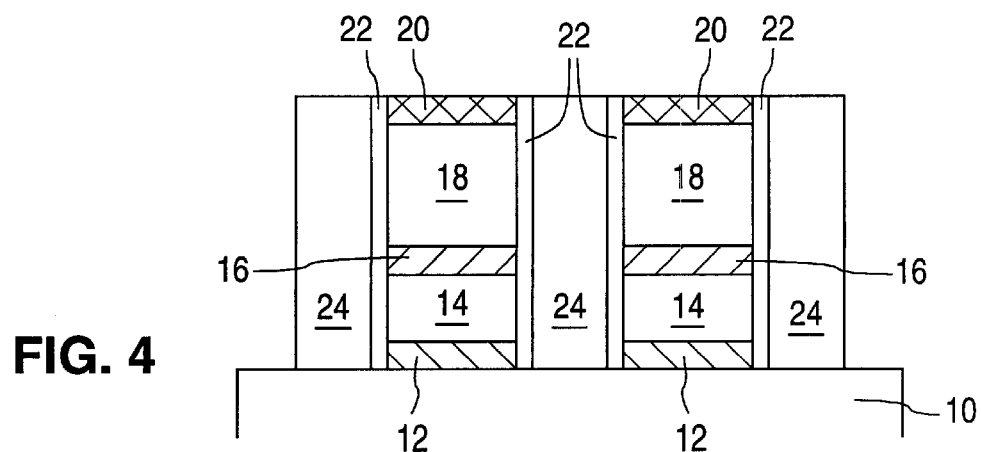

Next, referrring to FIG. 4, a second dielectric layer 24, e.g. silicon oxide, is deposited, using High Density Plasma (HDP) oxide deposition or spin on glass (SOG) for example, overlying the exposed first dielectric layer 10 and filling the gaps between the patterned stack. Those skilled in the art will appreciate that dielectrics other than HDP silicon dioxide, either organic or inorganic can be utilized, and applied in different, well-known ways (e.g. spin-on). The wafer is then planarized using a Chemical Mechanical Processes (CMP) to expose the upper surface of the antireflective diffusion barrier layer 20, resulting in the structure shown in FIG. 4. (Of course, if the antireflective layer 20 is not utilized, then the planarization step will expose patterned copper 18.)

The exposed upper surface of the antireflective diffusion barrier layer 20 (or the copper 18, if layer 20 is not used) is then patterned using a via exclusion mask (not shown) and etched down through the second copper layer 18 to form copper via pillars with a cap formed from the material of the antireflective diffusion barrier layer 20, the underlying etch stop layer 16 serving as an etch stop to etching of the second copper layer 16. If the copper via pillar etch is not selective to the conductive diffusion barrier material, then those portions of the conductive barrier layer 22 exposed by the via pillar etch will also be removed and the process can proceed. However, if the copper via pillar etch is selective to the conductive diffusion barrier material, then, to avoid shorts between via pillars, the via pillar etch must be followed by an isotropic etch of the exposed conductive diffusion barrier material that is selective to copper.

Since the conductive diffusion barrier material has now been removed from exposed sidewalls, and since exposed sidewalls of the copper via pillars now lack a diffusion barrier, a conformal dielectric diffusion barrier layer 25, e.g. silicon nitride, is formed on all exposed surfaces.

Following deposition of the conformal dielectric diffusion barrier layer 25, a third layer 26 of dielectric material, e.g. silicon oxide, is then deposited overlying the wafer and filling the gaps created by the via pillar etch. The wafer is then planarized, e.g. using CMP, thereby exposing the upper surface of the via pillar caps which, as described above, are formed of antireflective diffusion barrier layer material in the preferred embodiment. The resulting structure is shown in FIG. 5.

Figure 5:
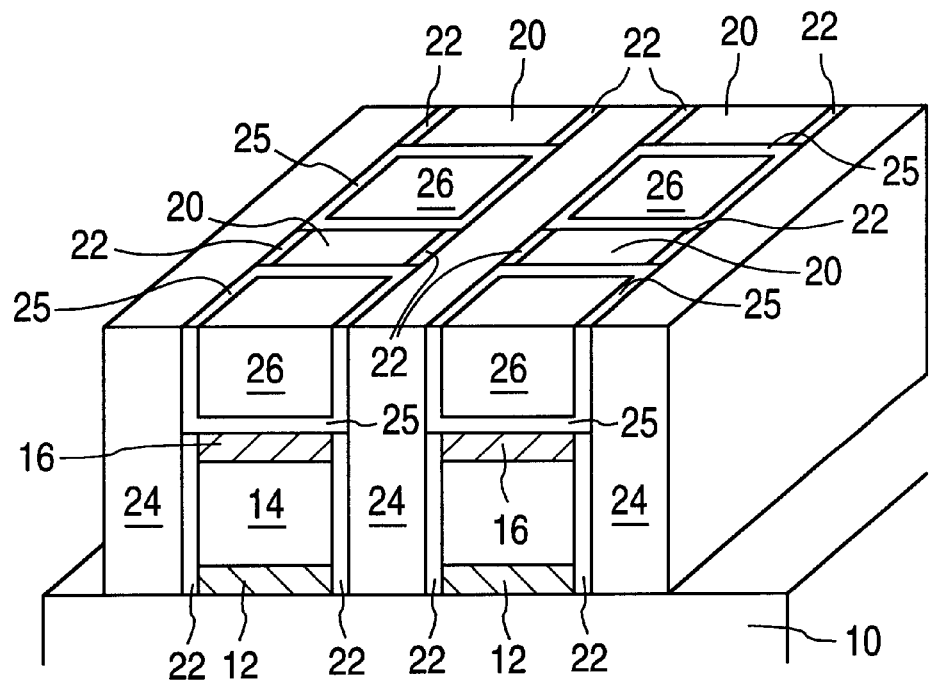
Figure 6:
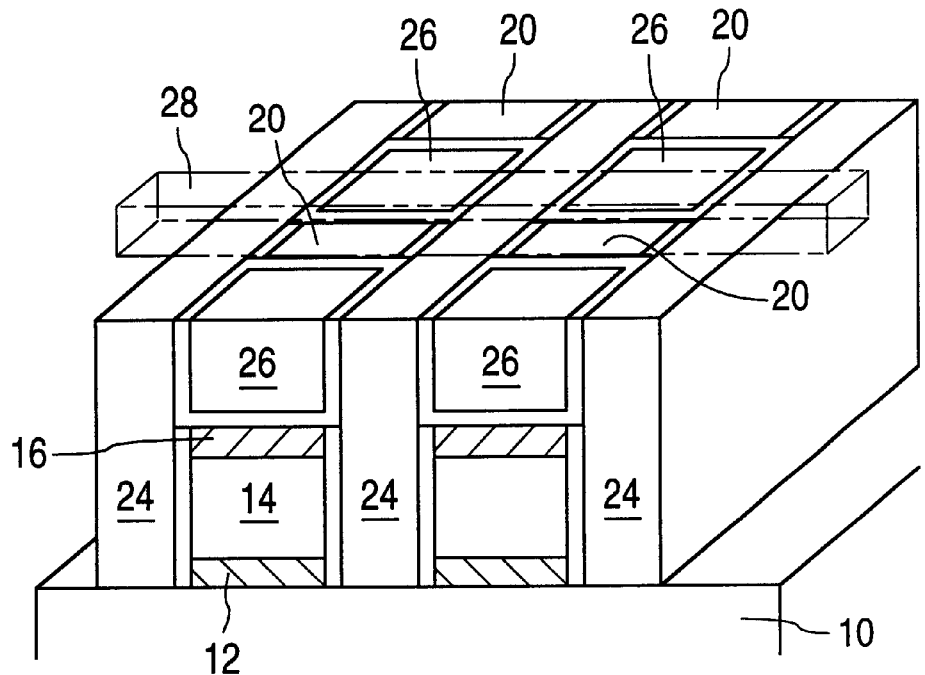

A third upper layer of conductive material, shown in phantom lines 28 in FIG. 6, e.g. copper, is then deposited overlaying the FIG. 5 structure and patterned to contact the upper surface of the via pillar, thus connecting two levels of metal interconnect in a semiconductor device with the copper-based pillars serving as the vias between the lower and upper patterned interconnect levels.

Those skilled in the art will appreciate that the above-described steps can be repeated as many times as needed to form a desired multilevel interconnect structure.

Various other modifications and alterations in the structure and method of fabrication of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the invention and that structures and methods within the scope of these claims and their equivalents be covered thereby.

What is claimed is:

1. An interconnect structure formed as part of a semiconductor device structure, the interconnect structure comprising:

a patterned copper lower interconnect layer formed on an underlying layer as part of the semiconductor device structure, the patterned copper lower interconnect layer having conductive diffusion barrier material formed on vertical sidewalls thereof;

conductive via pillars formed in spaced-apart relationship on an upper surface of the lower interconnect layer, the via pillars including copper, first portions of vertical sidewalls of the conductive via pillars having conductive diffusion barrier material formed directly thereon, second portions at the vertical sidewalls at the conductive via pillars having dielectric diffusion barrier material formed directly thereon; and a patterned copper upper interconnect layer formed in electrical contact with the via pillars.

2. An interconnect structure as in claim 1, and wherein the patterned copper lower interconnect layer includes a lower diffusion barrier layer formed on the underlying layer, a first copper layer formed on the diffusion barrier layer and an etch stop layer formed on the first copper layer.

3. An interconnect structure as in claim 2, and wherein the lower diffusion barrier layer comprises a material selected from the group consisting of tantalum, tantalum nitride, tungsten, tungsten nitride, titanium, titanium nitride, and combinations thereof.

4. An interconnect structure as in claim 2, and wherein the etch stop layer comprises a material selected from the group consisting of tantalum, tantalum nitride, tungsten, tungsten nitride, titanium, titanium nitride, and combinations thereof.

5. An interconnect structure as in claim 2, and wherein the conductive via pillars comprise a second copper layer formed on the lower interconnect layer and a conductive antireflective diffusion barrier layer formed on the second copper layer.

6. An interconnect structure as in claim 5, and wherein the antireflective diffusion barrier layer comprises a material selected from the group consisting of tantalum, tantalum nitride, tungsten, tungsten nitride, titanium, titanium nitride, and combinations thereof.

7. An interconnect structure as in claim 1, and wherein the conductive diffusion barrier material comprises TiN.

8. An interconnect structure as in claim 1, and wherein the conductive diffusion barrier material comprises TaN.

* * * * *